Figure 1:
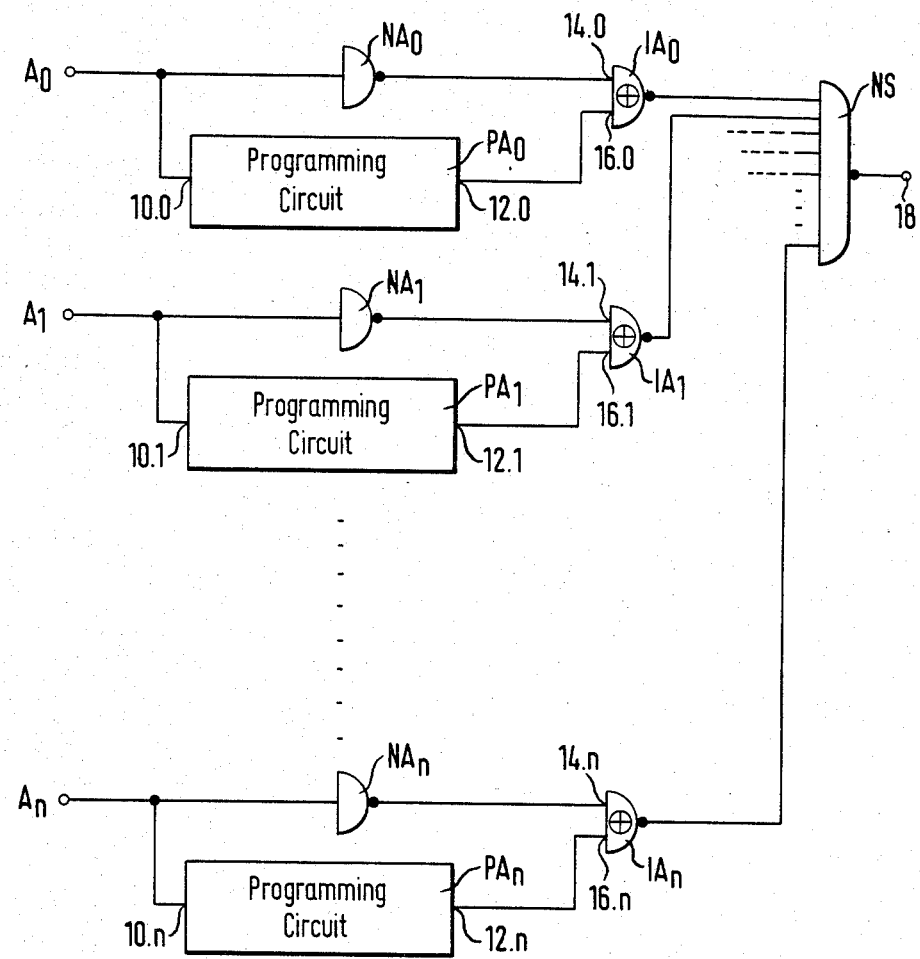

United States Patent [19]

Huse et al.

[11] Patent Number: 4,536,738
[45] Date of Patent: Aug. 20, 1985

[54] PROGRAMMABLE CIRCUIT ARRANGEMENT

[75] Inventors: Horst Huse, Langenpreising; Werner Elmer, Freising, both of Fed. Rep. of Germany

[73] Assignee: Texas Instruments Incorporated, Dallas, Tex.

[21] Appl. No.: 460,501

[22] Filed: Jan. 24, 1983

[30] Foreign Application Priority Data

Jan. 27, 1982 [DE] Fed. Rep. of Germany ....... 3202543
Jan. 18, 1983 [EP] European Pat. Off. ........ 83100394.2

[51] Int. Cl.³ .............................................. G06F 7/04
[52] U.S. Cl. .................................... 340/146.2; 365/96
[58] Field of Search ................. 307/463, 465; 365/96; 340/146.2

[56] References Cited

U.S. PATENT DOCUMENTS

| | | | |
|---|---|---|---|
| 3,289,159 | 11/1966 | Woodward, Jr. ................ | 340/146.2 |
| 3,872,450 | 3/1975 | Reynolds ................... | 365/96 |
| 3,943,487 | 3/1976 | Pottle .................... | 340/146.2 |
| 3,976,983 | 8/1976 | Moussie .................... | 340/173 SP |
| 3,987,345 | 10/1976 | Kato ........................ | 340/146.2 X |
| 4,158,147 | 6/1979 | Edwards .................... | 365/96 X |
| 4,205,302 | 5/1980 | Godo ....................... | 340/146.2 |
| 4,329,685 | 5/1982 | Mahon et al. ................ | 340/825.84 |
| 4,446,534 | 5/1984 | Smith ...................... | 365/96 |

OTHER PUBLICATIONS

A. M. Marques, Electrical Inspection of PROM Memory Links, 18th Annual Proceeding-Reliability Physics 1980, Apr. 8-10, 1980, pp. 197-204.

*Primary Examiner*—Charles E. Atkinson
*Attorney, Agent, or Firm*—Richard A. Bachand; N. Rhys Merrett; Melvin Sharp

[57] ABSTRACT

A programmable circuit arrangement is described which can be programmed by applying a programming voltage so that it delivers at its output a signal having a predetermined binary value. The circuit arrangement comprises an input means responsive to the programming voltage. Further, it comprises a conducting means connected to the input means and capable of being brought to a non-conductive state upon application of the programming voltage to the input means. The circuit arrangement further comprises an output means connected to the conductive means and delivering a signal having one binary value in the conductive state of the conductive means and the other binary value in the non-conductive state of the conductive means.

5 Claims, 2 Drawing Figures

PROGRAMMABLE CIRCUIT ARRANGEMENT

The invention relates to a programmable circuit arrangement which can be programmed by applying a programming voltage so that it delivers at its output a signal having a predetermined binary value.

Circuit arrangements of this type, for example, can be used for forming registers suitable for permanently storing predetermined binary words. By use of such registers it is possible to design circuits for checking the identity of binary words by means of which it can be checked whether a binary word permanently stored in the register is identical with a binary word to be checked. The bits of the binary word to be checked are individually applied to separate bit inputs, and the bits of the binary word stored in the register are applied to further bit inputs. In an identity checking circuit the bits are then compared pair-wise. The signals delivered by the identity checking circuits are then combined in a NAND-gate which, when identity has been determined between all pairs of compared bits, delivers a signal of the value "L", while it delivers a signal of the value "H" whenever two compared bits are not identical.

When the bit words under comparison have a larger number of digits it is unfavorable to provide separate bit inputs for the bits of the word to be checked and for the bits of the predetermined word. For example, when the binary word to be checked is a 16-digit address for addressing a data memory such a check of address can hardly be accomplished in a single integrated circuit, because in this case 32 terminals have to be provided for the bits to be checked pair-wise and such a great number of terminals is highly undesirable. The binary word therefore must be broken down and two integrated circuits are required.

The same problem arises when the register formed by means of the above-described circuit arrangment is to be used for storing a binary constant which is to be added to a binary variable in a parallel adder. With 16-digit constants and variables 32 inputs are necessary for carrying out the desired parallel addition. When such an adder circuit is to be designed as an integrated circuit the necessary 32 inputs are very burdensome.

The invention deals with the problem of designing a circuit arrangement of the type described so that the number of input terminals can be reduced to half when it is used in the above application examples.

According to the invention this problem is solved by input means responsive to the programming voltage, conductive means connected to said input means capable of being brought to a non-conductive state upon application of said programming voltage to said input means, and output means connected to said conductive means for delivering a signal having one binary value in the conductive state of said conductive means and the other binary value in the non-conductive state of the conductive means.

The circuit arrangement according to the invention is programmed by applying the programming voltage to its input means. Due to this fact it is possible to use the input, in addition to its use as programming input, also as a signal input by which the signals to be processed are set to the circuitry in which the programmable circuit arrangement according to the invention is used. As programming input the input is only used once, namely when by applying the programming voltage it is to be defined which binary value the output means is to deliver.

Advantageous further embodiments of the invention are characterized in the subclaims. In the advantageous use of the circuit arrangement according to the invention as defined in claim 8 the predetermined binary word is set in the circuit arrangements themselves so that at the outputs they deliver signals having the desired binary value. The voltage required for the setting operation is applied to the same bit input at which during the later checking operation the bit of the binary word under comparison is applied. In this way separate inputs for the predetermined binary word are obviated, and also the use of additional units for setting the predetermined binary word is unnecessary.

Figure 2:
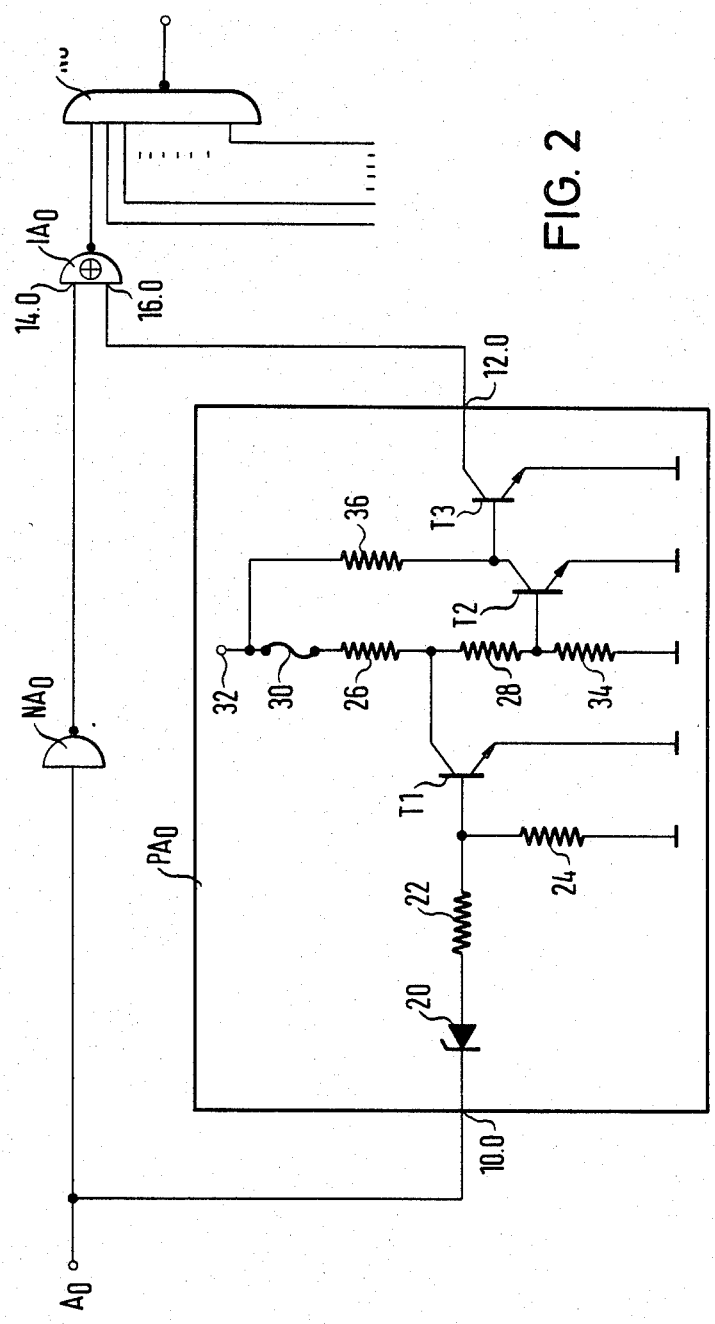

The invention will now be explained by way of example with reference to the drawings, wherein FIG. 1 is a schematic circuit diagram of an example of use of the circuit arrangement according to the invention in a checking circuit for checking the identity of two binary words and FIG. 2 is one stage of the checking circuit of FIG. 1 wherein the details of the programmable circuit arrangement according to the invention are shown.

The circuit arrangement shown in FIG. 1 for checking the identity between two binary words comprises a plurality of inputs $A_O$ to $A_n$ equal to the number of bits of which each of the binary words is composed. The binary words under comparison may be 16-bit memory addresses, for example, whose 16 bits are applied to inputs $A_O$ to $A_{15}$ and which are to be checked as to identity with a predetermined 16-bit memory address. Only after identity of the fed memory address and the predetermined memory address has been determined access to a memory location characterized by said address is allowed for.

Bits applied to the inputs $A_O$ to $A_n$ arrive at negator circuits $NA_O$ to $NA_n$ where their values are negated. The inputs $A_O$ to $A_n$ are also connected to the inputs $10.0$ to $10.n$ of programming circuits $PA_O$ to $PA_n$ which may be programmed so that each of their outputs $12.0$ to $12.n$ delivers a signal with a selectable binary value, as will be described hereafter. The outputs of the negator circuits $NA_O$ to $NA_n$ are each connected to an input $14.0$ to $14.n$ of an identity checking circuit $IA_O$ to $IA_n$ formed by an equivalence gate. The outputs $12.0$ to $12.n$ of the programming circuits $PA_O$ to $PA_n$ are each connected to the second input $16.0$ to $16.n$ of the identity checking circuits $IA_O$ to $IA_n$. The outputs of the identity checking circuits $IA_O$ to $IA_n$ are connected to the inputs of a NAND circuit NS delivering at its output $18$ a signal indicating by its value the identity or non-identity of the compared binary words.

The programming circuits $PA_O$ to $PA_n$ are so designed that initially they deliver at their outputs $12.0$ to $12.n$ a signal with the binary value "H". The binary values appearing at the outputs $12.0$ to $12.n$ of the programming circuits $PA_O$ to $PA_n$ are the binary values of the bits of the predetermined binary word. Yet, it must be considered that the identity checking circuits $IA_O$ to $IA_n$ compare the binary value from the output of the associated programming circuits with the negated binary value at the corresponding input $A_O$ to $A_n$ since the negator circuit $NA_O$ to $NA_n$ performs a corresponding negation. The identity checking circuits $IA_O$ to $IA_n$ thus determine identity when the binary value of the signal at the input $A_O$ to $A_n$ is opposed to the binary value of the signal at the output $12.0$ to $12.n$ of the corresponding programming circuit $PA_O$ to $PA_n$. However, this is only a peculiarity of the special embodiment of the programming circuit shown in detail in FIG. 2. With a different design of the programming circuits so that initially they deliver a signal with the binary value "L" the negator circuits $NA_O$ to $NA_n$ could be omitted.

Assuming, for example, that a signal having the binary value "L" is applied to the input $A_O$, there appears, as a result of negation in the negator circuit $NA_O$, a signal having the binary value "H" at the input 14.0 of the identity checking circuit $IA_O$. Since also the programming circuit $PA_O$ delivers a signal having the binary value "H", as mentioned above, the identity checking circuit $IA_O$ determines identity of the signals presented thereto and consequently it delivers at its output a signal having the value "H". This signal arrives at an input of the NAND circuit NS. If also the signals at the other inputs $A_1$ to $A_n$ have the binary value "L", also the other identity checking circuits $IA_1$ to $IA_n$ determine the identity of the inputted signals and accordingly deliver signals having the value "H" to the NAND circuit NS. The latter thereupon delivers at its output a signal having the value "L" indicating that the binary values of the bits fed to the inputs $A_O$ to $A_n$ (after negation thereof in the negator circuits $NA_O$) and the binary values of the output signals of the programming circuits $PA_O$ to $PA_n$ are identical. On the other hand, if at least one signal at one of the inputs $A_O$ to $A_n$ has the binary value "H", there appears the binary value "L" at the input 14 of the associated identity checking circuit IA with the consequence that said identity checking circuit delivers a signal having the value "L". The NAND circuit NS therefore does not receive the binary value "H" at all its inputs so that it delivers at its output a signal having the value "H" indicating that at least one of the compared bit pairs exhibits non-identity of the binary values.

The above described example explained a situation where all programming circuits $PA_O$ to $PA_n$ deliver a signal having the value "H", which implies that all the bits of the predetermined binary word have the value "H". The identity checking circuits $IA_O$ to $IA_n$ determine identity of the signals fed thereto if all the bits of the second binary word have the value "L". However, normally the bits of the predetermined binary word have different binary values, which implies that the programming circuits PA must be set so that some of them also deliver the value "L" at their outputs 12, if necessary. FIG. 2 shows the detailed setup of the programming circuit $PA_O$ which applies to all programming circuits and which—without special programming measures—delivers at its output 12.0 a signal having the binary value "H" and—by a special programming operation—can be irreversibly set so that it delivers the binary value "L".

The programming circuit $PA_O$ contains a zener diode 20 whose cathode forms the output 10.0 connected to the input $A_O$. The anode of the zener diode 20 is connected to a resistor 22 connected to the base of a transistor T1. Moreover, the base of said transistor T1 is connected via a resistor 24 to ground. Also the emitter of said transistor T1 is connected to ground. The collector of the transistor T1 leads to a junction point of two resistors 26 and 28. The other terminal of the resistor 26 leads over a fuse link 30 to a terminal 32 to which the positively operating voltage is permanently applied. The resistor 28 is connected to a further resistor 34 connected with one terminal to ground, and the junction point of the resistors 28 and 34 is connected to the base of a transistor T2 whose emitter is connected to ground. The collector of the transistor T2 is connected to the terminal 32 via a resistor 36. Moreover, the collector of the transistor T2 is connected to the base of a further transistor T3 whose emitter is connected to ground and whose collector forms the output 12.0 of the programming circuit $PA_O$.

For the purpose of describing the mode of effect of the programming circuit shown in FIG. 2 it is assumed that the operating voltage supplying the components of the entire circuit arrangement, i.e. the negator circuit NA, the identity checking circuit IA and the NAND circuit NS, and permanently applied to the terminal 32 has the value +5 V which is usual for TTL circuits. The voltage representing the binary value "H" has a value between 2 V and the operating voltage, as likewise usual for TTL circuits, and the voltage representing the binary value "L" has a value less than 0.8 V.

The zener voltage of the zener diode 20 is selected so that it is higher than the maximum voltage occurring at the input $A_O$. By way of example a zener voltage of 10 V is selected. This implies that a voltage applied at the input $A_O$ and representing a binary value cannot have any influence on the programming circuit $PA_O$ because the zener diode 20 is non-conducting at all voltage values below 10 V. Since the base of the transistor T1 is connected to ground via the resistor 24, said transistor is in the off state. From the terminal 32 connected to the voltage source current flows through the uninterrupted fuse link 30 and the resistors 26, 28 and 34 which, owing to the dimensioning of the resistors, is so adjusted that the transistor T2 is in the on state. As a consequence, the base of the transistor T3 is connected to ground via the collector-emitter path of the transistor T2 so that the transistor T3 is in the off state. Therefore, at the output 12.0 there appears a voltage corresponding to the binary value "H". If it is to be determined whether the bit at the input $A_O$ has the value "L", the programming circuit $PA_O$ is used in the state shown in FIG. 2, i.e. with uninterrupted fuse link 30. In this case the identity checking circuit $IA_O$, both at its input 16.0 and—due to negation by the negator circuit $NA_O$—at its input 14.0, receives a signal having the binary value "H".

On the other hand, if it is to be checked whether the signal at the input $A_O$ has the binary value "H", care must be taken that the programming circuit $PA_O$ delivers at its output 12.0 a signal having the value "L". To this end a voltage is applied to the input $A_O$ which is higher than the zener voltage of the zener diode 20. Such a voltage renders the zener diode 20 conductive so that current flows to the base of the transistor T1 rendering it conducting. From the terminal 32 connected to the operating voltage current can flow through the fuse link 30, the resistor 26 and the transistor T1 which is so high that it causes the fuse link 30 to blow. Thereupon the voltage applied to the input $A_O$ for performing this programming operation is cut off.

When the fuse link 30 is interrupted the programming circuit $PA_O$ delivers at its output 12.0 a signal having the binary value "L", because the transistor T2 is in the off state for lack of base current, and the transistor T3 is conductive on account of the base current delivered thereto via the resistor 36. In the event that the programming circuit $PA_O$ has been programmed in such a way, the identity checking circuit $IA_O$ delivers a signal indicating identity of its input signals when a signal having the binary value "H" is applied to its input $A_O$.

Hence, with the described circuit arrangement it is possible to compare two binary words and to indicate their identity or non-identity. The bits of one binary word are formed by the signals at the outputs 12.0 to 12.$n$ of the programming circuits $PA_O$ to $PA_n$. The bits of the binary word to be checked are applied to the inputs $A_O$ to $A_n$. Then the identity circuits $IA_O$ to In compare the bit predetermined by the respective programming circuit with the bit applied to the corresponding input (in consideration of the negation), and the NAND circuit NS then combines the output signals of the identity circuits $IA_O$ to $IA_n$ and generates a signal indicating identity or non-identity of the compared binary words.

The described circuit arrangement can be readily realized in the form of an integrated circuit. Aside from the terminals for the operating voltages it only requires a number of terminals corresponding to the number of bits of the binary word to be checked. Separate terminals for the predetermined binary word are not required as said binary word is permanently set in the integrated circuit by programming the programming circuits in the manner described above with the use of the same inputs to which later on the binary word to be checked is applied.

We claim:

1. A circuit which can be programmed by applying a programming voltage so that the circuit delivers a signal at its output having a predetermined binary value, comprising:

input means responsive to the programming voltage, including, threshold switching means connected to an input terminal and having a threshold less than said programming voltage and first switching means having a controlled terminal connected to said threshold switching means, wherein upon application of said programming voltage to said input terminal said threshold switching means switches to a conductive state and renders the first switching means conducting, a fuse link connected to said first switching means, said fuse link being changable from a conductive state to a non-conductive state when the current flowing therethrough exceeds a predetermined value, upon application of said programming voltage to said input means; and output means connected to said fuse link for delivering a signal having one binary value in the conductive state of said fuse link and the other binary value in the non-conductive state of the fuse link.

2. The circuit according to claim 1, wherein said output means comprises second switching means having a controlled terminal connected to the output of said first switching means and third switching means having a controlled terminal connected to the output of said second switching means wherein the output of said third switching means is the output of said output means.

3. The circuit of claim 2, wherein said threshold switching means comprises a zener diode having a cathode connected to said input terminal and said first switching means comprises a transistor having a collector-emitter path connected serially to said fuse link and a base connected to the anode of said zener diode.

4. The circuit of claim 3, wherein the series circuit comprising the collector-emitter path of transistor of the first switching means and the fuse link is connected between a supply voltage terminal and ground.

5. The circuit of claim 4, wherein the output means is connected to said series circuit in such a manner that it delivers a signal having one or the other binary value depending on the current flowing through said series circuit.

* * * * *